(12) United States Patent
Lilak et al.

(10) Patent No.: US 10,991,696 B2
(45) Date of Patent: Apr. 27, 2021

(54) VERTICALLY STACKED DEVICES WITH SELF-ALIGNED REGIONS FORMED BY DIRECT SELF ASSEMBLY (DSA) PROCESSING

(71) Applicant: Intel Corporation, Santa Clara, CA (US)

(72) Inventors: Aaron D. Lilak, Beaverton, OR (US); Patrick Theofanis, Portland, OR (US); Cory E. Weber, Hillsboro, OR (US); Stephen M. Cea, Hillsboro, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/473,699

(22) PCT Filed: Mar. 15, 2017

(86) PCT No.: PCT/US2017/022585
§ 371 (c)(1),
(2) Date: Jun. 26, 2019

(87) PCT Pub. No.: WO2018/169528
PCT Pub. Date: Sep. 20, 2018

(65) Prior Publication Data
US 2019/0341384 A1    Nov. 7, 2019

(51) Int. Cl.
*H01L 27/105* (2006.01)
*H01L 21/32* (2006.01)
*H01L 27/11556* (2017.01)
*H01L 27/11582* (2017.01)
*H01L 29/78* (2006.01)

(52) U.S. Cl.
CPC .......... *H01L 27/1052* (2013.01); *H01L 21/32* (2013.01); *H01L 27/11556* (2013.01); *H01L 27/11582* (2013.01); *H01L 29/7827* (2013.01)

(58) Field of Classification Search
CPC .......... H01L 27/1052; H01L 27/11556; H01L 21/32; H01L 29/7827; H01L 27/11582
See application file for complete search history.

(56) References Cited

U.S. PATENT DOCUMENTS

| | | |
|---|---|---|
| 2013/0309457 A1 | 11/2013 | Rathsack et al. |
| 2015/0053928 A1* | 2/2015 | Ching ................ H01L 27/0924 257/29 |
| 2015/0243514 A1 | 8/2015 | Ruiz et al. |
| | | (Continued) |

OTHER PUBLICATIONS

International Preliminary Report on Patentability from PCT/US2017/022585 notified Sep. 26, 2019, 9 pgs.

(Continued)

*Primary Examiner* — Dung A. Le
(74) *Attorney, Agent, or Firm* — Green, Howard & Mughal LLP

(57) ABSTRACT

An integrated circuit structure is provided which comprises: a stack of source regions of a stack of transistors and a stack of drain regions of the stack of transistors; and a gate stack that forms gate regions for the stack of transistors, wherein the gate stack comprises traces of a first polymer of a block copolymer, the block copolymer comprising the first polymer and a second polymer.

12 Claims, 13 Drawing Sheets

(56) References Cited

U.S. PATENT DOCUMENTS

2015/0303289 A1  10/2015  Lee et al.
2016/0086970 A1   3/2016  Peng
2016/0365429 A1  12/2016  Nyhus et al.

OTHER PUBLICATIONS

International Search Report and Written Opinion from PCT/US2017/022585 notified Dec. 14, 2017, 13 pgs.

* cited by examiner

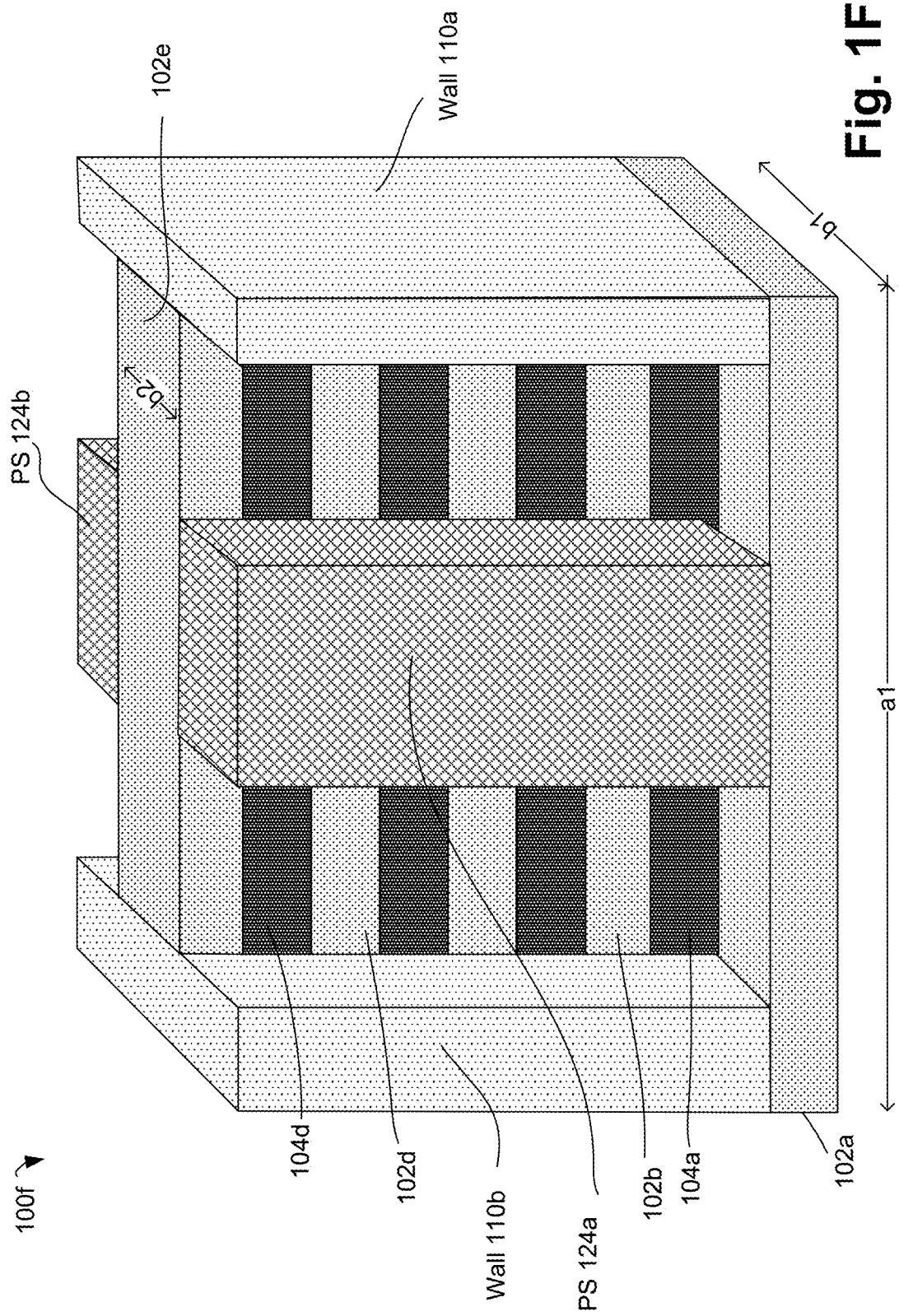

VERTICALLY STACKED DEVICES WITH SELF-ALIGNED REGIONS FORMED BY DIRECT SELF ASSEMBLY (DSA) PROCESSING

BACKGROUND

Vertically stacked devices (e.g., vertically stacked transistors) may comprise components stacked vertically on a substrate in multiple layers. Often times, lithography and etching may be used to pattern individual layers independently. However, lithographic process for individual layers can be time consuming and/or costly, and may not result in fully aligned components (e.g., due to tapering of an etch process).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 1A-1I schematically illustrate a process for formation of vertically stacked devices using Direct Self Assembly (DSA) techniques, according to some embodiments.

DETAILED DESCRIPTION

Figure 1A:
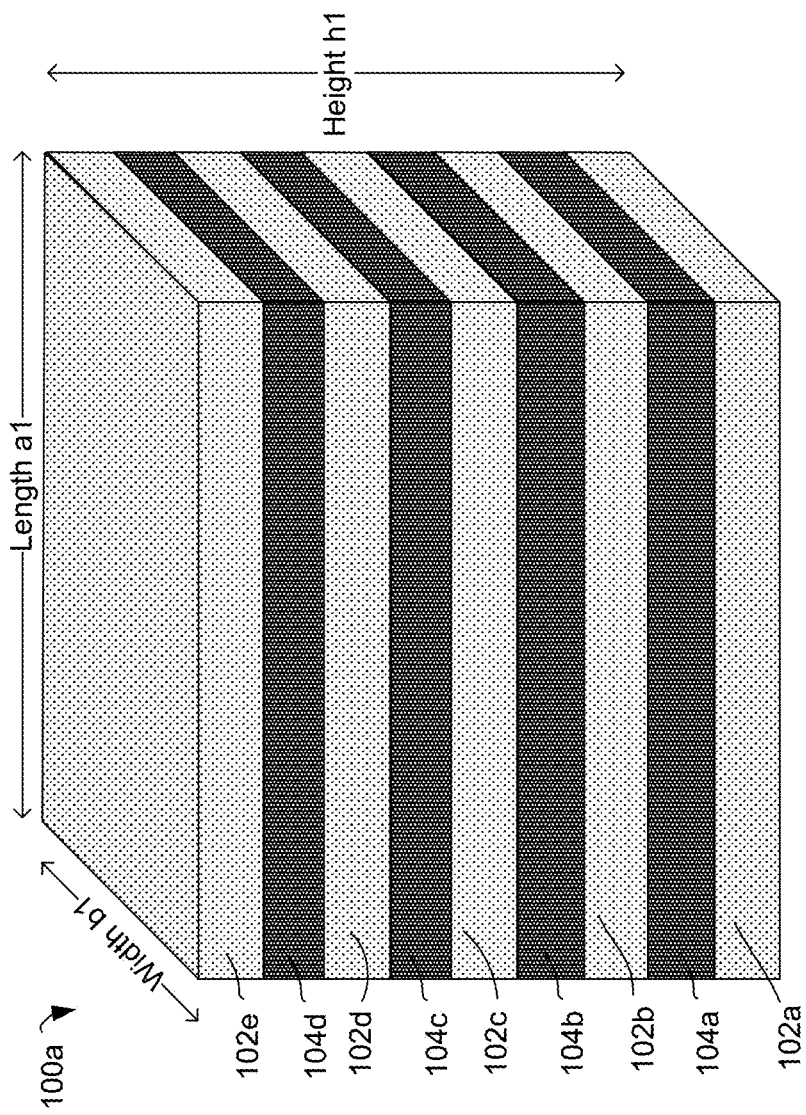

In some embodiments, a vertical stack of transistors may be formed by a DSA process using BCP, which may comprise a first polymer and a second polymer. In some embodiments, the first and second polymers may be PS and PMMA, and the BCP may be PS-b-PMMA.

For example, PS-b-PMMA layers may be formed adjacent to a vertical stack of semiconductor material. Such PS-b-PMMA layers may be formed using one or more appropriate DSA techniques, e.g., graphoepitaxy and/or chemoexpitaxy. In an example, the PS may be deposited between the PMMA.

In some embodiments, the PMMA may be removed to expose sections of the vertical stack of semiconductor material. The exposed sections of the vertical stack of semiconductor material may be doped through the openings formed by removal of the PMMA. The openings may be filled with insulating material. Subsequently, the PS may be selectively removed, and replaced with a vertical gate stack for the vertical stack of transistors.

There are many technical advantages of the various embodiments. For example, DSA applied using BCP such as PS-b-PMMA, may be used to form a large number of vertically stacked devices. The source regions of these devices may be self-aligned, and similarly the drain, gate and channel regions may also be self-aligned. Such alignment of various vertically stacked devices using, for example, lithography and etching, may not be possible (e.g., when the number of devices increases), for instance, due to tapering of an etch process. Thus, a conventional process may require patterning of individual layers using lithography, which may be time consuming and/or costly. In contrast, the mechanisms of the various embodiments result in self-aligned regions of a large number of stacked devices. Furthermore, a width of a channel and a width of the gate stack of the stacked devices may be easily tuned by appropriately controlling the block fractions of the polymers in the BCP. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back,"

"top," "bottom," "over," "under," and the like in the description and in the claims, if any, are used for descriptive purposes and not necessarily for describing permanent relative positions.

FIGS. 1A-1I schematically illustrate a process for formation of vertically stacked devices using Direct Self Assembly (DSA) techniques, according to some embodiments. Referring to FIG. 1A, in some embodiments, a component 100a may be formed, where the component 100a comprises a plurality of layers 102a, ..., 102e (generally referred to as a layer 102 in singular, and layers 102 in plural), and a plurality of layers 104a, ..., 104d (generally referred to as a layer 104 in singular, and layers 104 in plural). In some embodiments, the layers 102 and the layers 104 are alternatingly stacked, e.g., such that a layer 104 is between two corresponding layers 102, as illustrated in FIG. 1A. In an example, layers 102e and 102a respectively form a top-most and a bottom-most layer of the component 100a.

In some embodiments, the layers 102 may comprise semiconductor material, such as silicon, in an appropriate form, and/or a compound comprising silicon or another semiconductor including, but not limited to, germanium, silicon-germanium (SiGe), Gallium arsenide (GaAs), Indium gallium arsenide (InGaAs), an appropriate III-V compound semiconductor, germanium-tin, lead telluride (PbTe), an appropriate II-VI semiconductor, amorphous semiconductor materials such as indium gallium zinc oxide (IGZO), and/or the like. In some embodiments, the layers 104 may comprise an appropriate oxide, an appropriate insulating material, and/or the like including, but not limited to, silicon dioxide, silicon nitride, silicon oxynitride, silicon carbide, and/or the like. Accordingly, the layers 102 may also be referred to as a silicon layer, a layer of semiconductor material, or the like. The layers 104 may also be referred to as an oxide layer, a layer of insulating material, or the like.

In some embodiments, although not illustrated in FIG. 1A, the component 100a may be formed on a substrate or wafer (e.g., the layer 102a may be formed on a substrate). In some other embodiments, the layer 102a may act as a substrate.

In some embodiments, the layers 102 and the layers 104 may have same or about similar length and breadth, e.g., such that these layers align when stacked, as illustrated in FIG. 1A. As an example, each of the layers 102 and the layers 104 has a length and a width of about a1 and b1. A height of the component 100a is about h1. In some embodiments, the length a1 may be considerably larger than the width b1 (such as in a Fin Field Effect Transistor (FinFET) or a nanowire device).

In some embodiments, the top-most layer (e.g., the layer 102e) may comprise insulating layer (e.g., similar to the layers 104). In some embodiments, the bottom-most insulating layer 104a may be thicker than (e.g., having a higher height) the other insulating layers 104b, 104c, 104d.

Although FIG. 1A illustrates a specific number of layers 102 and a specific number of layers 104, such numbers are merely examples, and the component 100a may have any different number of layers. Merely as an example, there may be a single layer, ones, tens, or even hundreds of layers 102 and 104 stacked vertically and alternatingly.

Figure 1B:
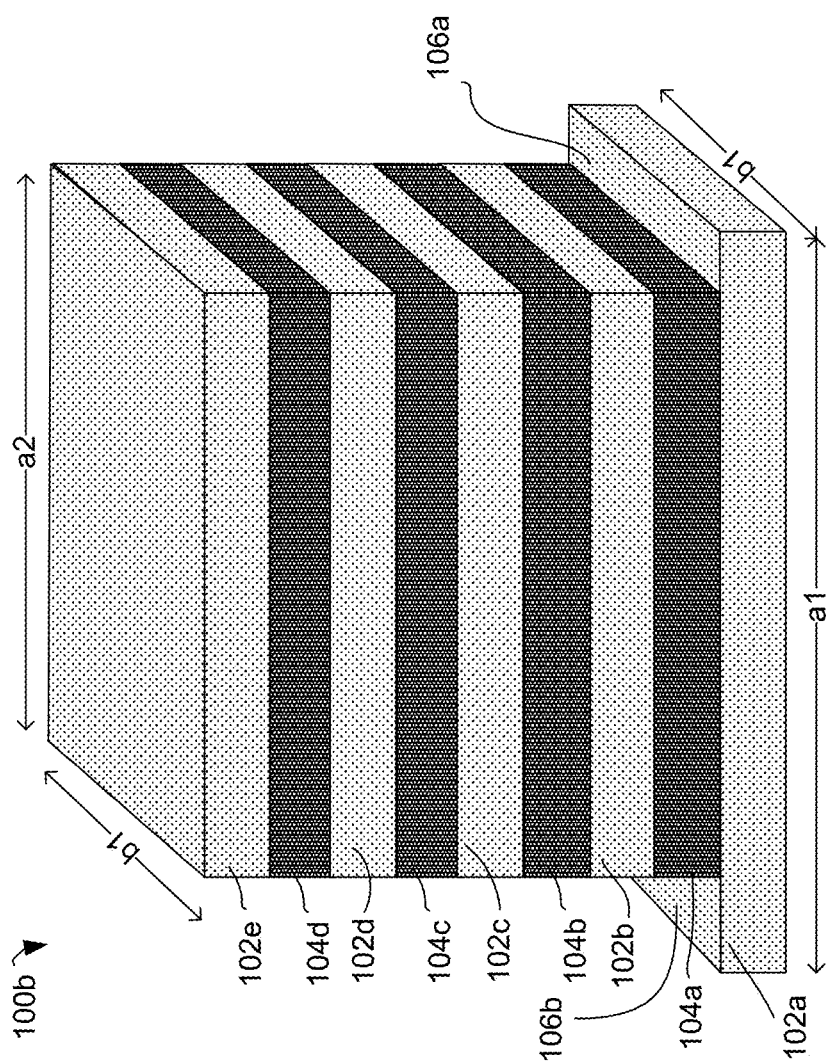

Referring to FIG. 1B, a component 100b may be formed by an etch process from the component 100a. For example, regions to be etched may be defined through a photolithographic process, and regions which are exposed may be etched with a process which may utilize a plasma or reactive ion etch process of the layers 102 and the layers 104, stopping at the bottom-most layer 102a. For example, the etching may be performed on the layers 102b, ..., 102e, and the layers 104a, ..., 104d, and the layer 102a may not be etched.

In some embodiments, the etching may be performed on both sides of each of the layers 102b, ..., 102e, and the layers 104a, ..., 104d, e.g., along the length of these layers (e.g., so that the length of these layers is reduced). In some embodiments, as a result of etching, a length each of the layers 102b, ..., 102e and the layers 104a, ..., 104d may be reduced from a1 to about a2 (e.g., while the width may remain at about b1). In an example, sections 106a and 106b of a top surface of the bottom-most layer 102a may be exposed due to the etching (e.g., trenches may be formed over the sections 106a and 106b of the top surface of the bottom-most layer 102a). Because the layer 102a is not etched, the length and width of the layer 102a may still be about a1 and b1, respectively.

In some embodiments, the dimension a1 may be significantly greater than the dimension b1 (e.g., greater by five times or higher), or the dimension b1 may be significantly greater than a1. For example, a ratio of a1 and b1 may be five times or higher, or a ratio of b1 and a1 may be five times or higher.

In some embodiments, the etching of various layers in FIG. 1B may be performed using any appropriate etch process (e.g., wet or dry chemical etch process, using lithography, etc.). Merely as an example, the selective etching may be performed by photolithographic techniques by, for example, forming a mask on a surface of component 100a having openings over the sections 106a and 106b, and then etching the layers from the top with an appropriate etchant.

In some embodiments, in the component 100b of FIG. 1B, the etching to reduce the layers 102b, 104b, ..., 102e may not form perfectly vertical walls. For example, FIG. 1B illustrates the sidewalls of the layers 102b, ..., 102e and the layers 104a, ..., 104d, which have been etched, to be vertical or almost vertical. However, in some other embodiments, the etched sidewalls of the layers 102b, ..., 102e and the layers 104a, ..., 104d may not be vertical, e.g., may have trapezoidal or another appropriate shape. Such non-vertical walls may be formed, for example, due to limitations of the etching process and/or by design. In such examples, a length of the layer 104a may be slightly larger than a2, and/or a length of the layer 102e may be slightly smaller than a2 (e.g., resulting in a trapezoidal shape of the etched layers).

In some embodiments, the etch process to form the component 100b may etch the semiconductor layers 102b, 102c, and 102d differently from etching the insulating layers 104a, 104b, 104c and 104d. In such examples, the insulating layer 104a ... 104d may have a width and/or a length that may be slightly less than or slightly greater than a width and/or a length of the semiconductor layers 102b, 102c, and 102d.

Figure 1C:
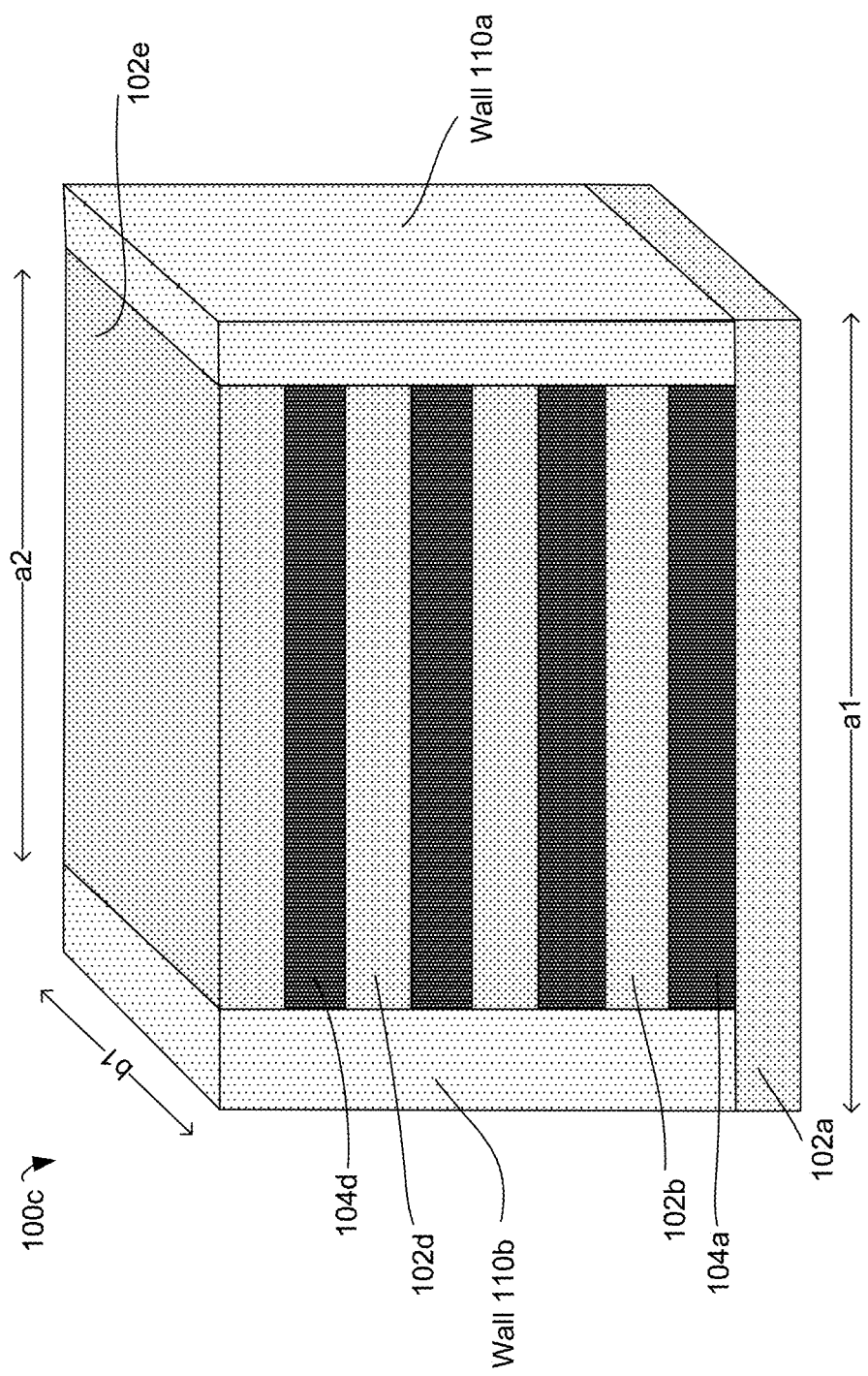

Referring to FIG. 1C, a component 100c may be formed by forming walls 110a and 110b on the exposed sections 106a and 106b of the top surface of the bottom-most layer 102a of the component 100b. In some embodiments, the walls 110a and 110b may include metal and/or conductive material, and/or may be substantially composed of a metal.

For example, a length and a width of the walls 110a and 110b may be substantially similar to a length and a width of the exposed sections 106a and 106b, respectively, of the top surface of the bottom-most layer 102a. In some embodiments, top surfaces of the walls 110a and 110b may be flush with the top surface of the top-most layer 102e. Any appropriate conductive metal (e.g., copper, aluminum, etc.) may be used for the walls 110a and 110b.

Figure 1D:
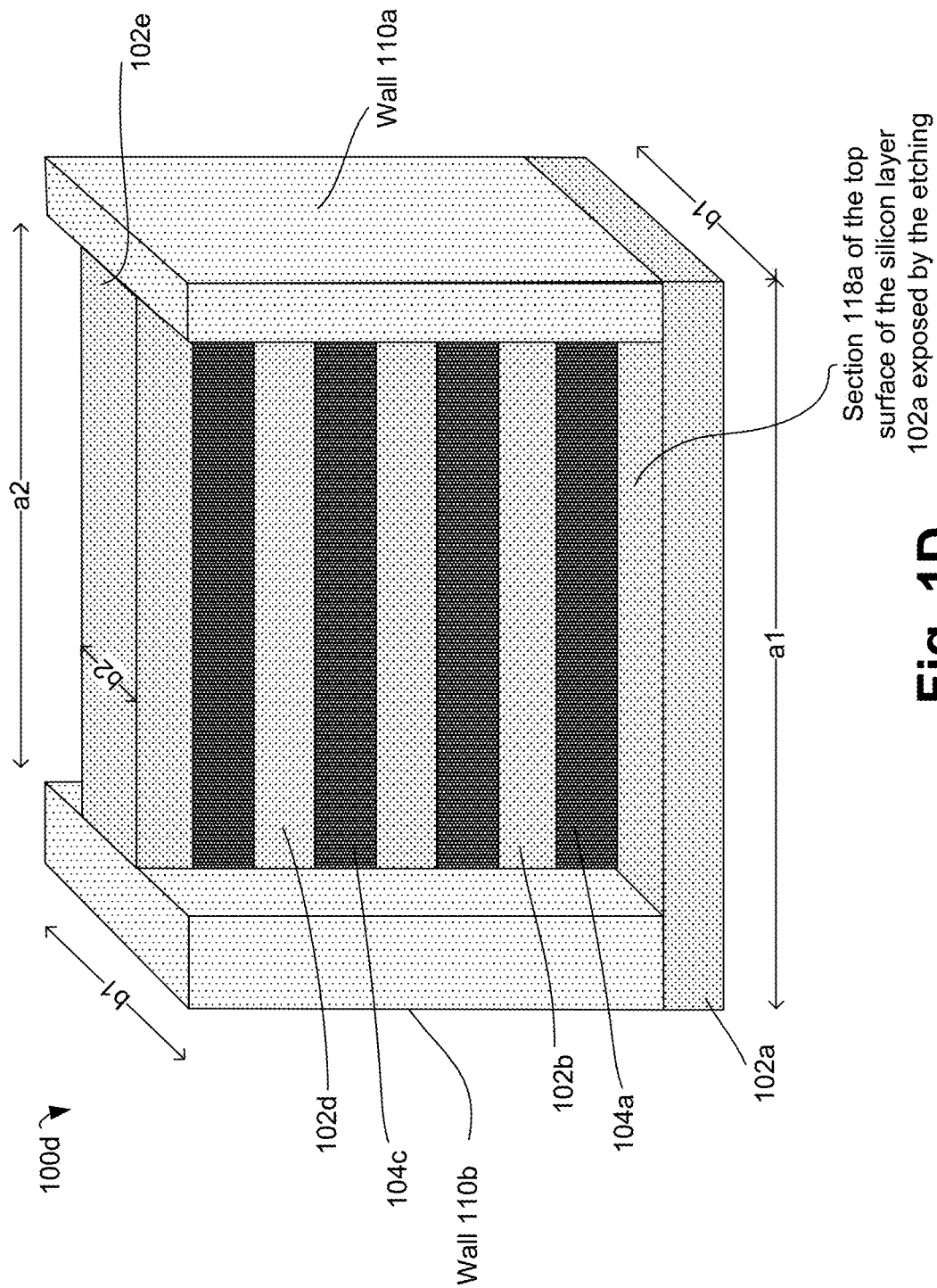

Referring to FIG. 1D, a component 100d may be formed by selectively etching sections of the layers 102 and the layers 104, except for the bottom-most layer 102a, of the component 100c. For example, the etching may be performed on the layers 102b, . . . , 102e and the layers 104a, . . . , 104d, and the layer 102a may not be etched. In some embodiments, the etching of various layers in FIG. 1D may be performed using any appropriate etch process (e.g., wet or dry chemical etch process, using lithography, etc.).

In some embodiments, the etching in FIG. 1D may be performed on both sides of each of the layers 102b, . . . , 102e and the layers 104a, . . . , 104d, e.g., along a width of these layers (e.g., such that the width is reduced due to the etching). For example, as a result of etching, the width of each of the layers 102b, . . . , 102e and the layers 104a, . . . , 104d may be reduced from b1 to about b2 (e.g., while the length may remain at about a2). Because the layer 102a is not etched, the length and width of the layer may still be about a1 and b1, respectively. Sections 118a and 118b on both sides of the top surface of the bottom-most layer 102a may be exposed due to the etching—however, only section 118a on one side is illustrated and labeled in FIG. 1D (the exposed section 118b on the other side is not visible in this figure).

In some embodiments, the etching of the layers 104a, . . . , 102e exposes sections of inner side of the walls 110a and 110b. The inner side of the walls 110a and 110b are the side facing the layers 104a, . . . , 102e. For example, two trenches on two sides of the etched layers may be formed, where sections of the walls 110a and 110b may form two side-walls of each of the two trenches.

In some embodiments, in the component 100d of FIG. 1D, the etching to reduce the layers 102b, 104b, . . . , 102e may not form perfectly vertical walls. For example, FIG. 1D illustrates the sidewalls of the layers 102b, . . . , 102e and the layers 104a, . . . , 104d, which have been etched, to be vertical or almost vertical. However, in some other embodiments, the etched sidewalls of the layers 102b, . . . , 102e and the layers 104a, . . . , 104d may not be vertical, e.g., may have trapezoidal or another appropriate shape. Such non-vertical walls may be formed, for example, due to limitations of the etching process and/or by design. In such examples, a width of the layer 104a may be slightly larger than b2, and/or a width of the layer 102e may be slightly smaller than b2 (e.g., resulting in a trapezoidal shape of the etched layers).

In some embodiments, the etch process to form the component 100d may etch the semiconductor layers 102b, 102c, and 102d differently from etching the insulating layers 104a, 104b, 104c and 104d. In such examples, the insulating layer 104a . . . 104d may have a width and/or a length that may be slightly less than or slightly greater than a width and/or a length of the semiconductor layers 102b, 102c, and 102d.

As discussed herein in further detail, direct self-assembly or DSA may be used to fill the trenches above the sections 118a and 118b of the top surface of the bottom-most layer 102a of FIG. 1D. The DSA technique allows a lateral separation of arrays to be as small as on the order of 8 nanometers (nm) to 10 nm and as large as many tens of nanometers.

DSA is a process where a chemical guide on a surface of a substrate is used to align a polymer. To form the interconnections by way of the DSA technique, in one embodiment, graphoepitaxy and/or chemoexpitaxy may be employed. Graphoepitaxy may be initially used to confine a volume for self-assembly and to form a pattern on which polymers of a block copolymer will assemble (confinement comes laterally through a fixed-width opening for formation of a vertical interconnect). Using chemoepitaxy, polymer molecules nominally called "brushes" may then be introduced in the confined volume and aligned in an ordered manner to the existing pattern. These molecules interact favorably with one of the block fractions (a 1-brush or single color scheme), or two brushes may be used that interact with one block fraction but not the other (a 2-brush or two color scheme).

Figure 2:
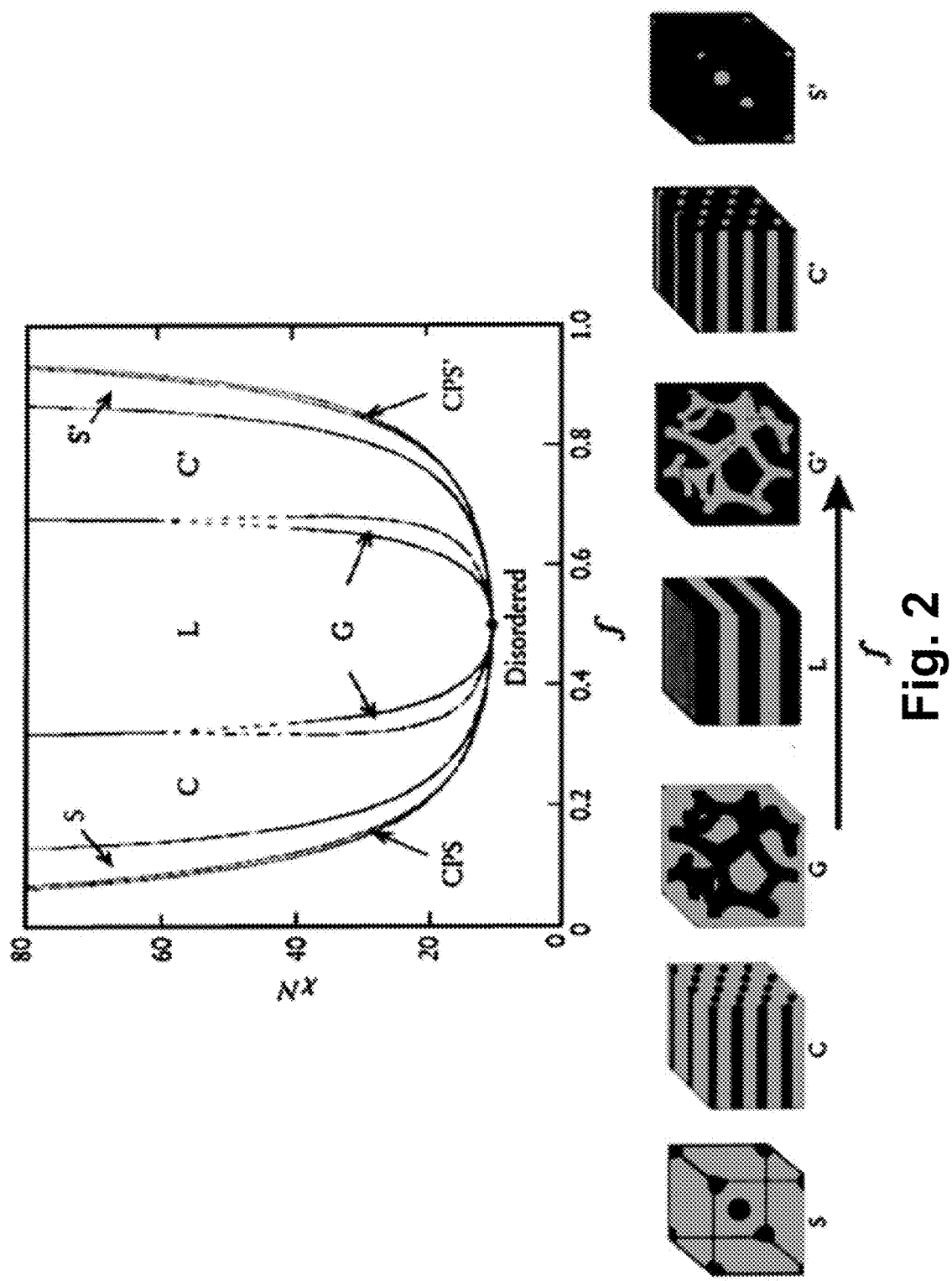
FIG. 2 illustrates a phase diagram for a polystyrene-b-polymethylmethacrylate (PS-b-PMMA) block copolymer and demonstrates the different morphologies as a block fraction of either polystyrene (PS) or polymethylmethacrylate (PMMA) relative to the other of PS or PMMA.

Brushes for a DSA process may be commercially available. Similarly, block copolymers may also be commercially available. The polymers can be readily engineered to provide different properties. One key parameter of interest is the Flory-Huggins $\chi$ parameter which describes how energetically favorable it is for the polymers to mix. By controlling this parameter, and the block fractions of each polymer component, a morphology of the resultant system when the polymers are mixed in contact with a metallic or insulating surface can be controlled. For example, PS-b-PMMA can be formulated in a symmetric 50:50 blend that produces lamellar self-assembled domains. If this fraction is adjusted to 30:70 or 70:30, the polymer produces cylinders of the minority fraction assembled in a hexagonal pattern in a sea of the majority fraction. The effect of changing the relative ratios of polystyrene (PS) to polymethylmethacrylate (PMMA) is shown in FIG. 2 upon the resultant morphologies of the polymer system. FIG. 2 illustrates a phase diagram for a PS-b-PMMA block copolymer and demonstrates the different morphologies as a block fraction of either PS or PMMA relative to the other of PS or PMMA. Either polymer may be considered since the phase diagram is symmetric about fractional composition f=0.5, where the x-axis represents the fractional composition of either of the polymers PS or PMMA, and the y-axis represents a function of the Flory-Huggins $\chi$ parameter. In FIG. 2, L represents an area where lamellar self-assembled domains are dominant; G where gyroid domains are dominant; C where cylindrical domains are dominant; and S where spherical domains are dominant. In one embodiment, fA values which produce cylindrical or spherical morphologies are used in a DSA process to form interconnections of device layers.

In some embodiments, BCP comprising PS-b-PMMA may be deposited within the inner side of the walls 110a and 110b. Various embodiments presented herein discuss forming the DSA layers, where the block copolymer may be PS-b-PMMA. However, in other examples, any other appropriate type of polymers may also be used. Examples of such polymers include, but are not limited to, poly(styrene)-b-poly(2-vinylpyridine) (PS-b-P2VP), poly(styrene)-b-poly(4-vinylpyridine) (PS-b-P4VP), poly(styrene)-b-poly(acrylic acid) (PS-b-PAA), poly(styrene)-b-poly(ethylene glycol) (PS-b-PEG), poly(styrene)-b-poly(imide) (PS-b-PI), and poly(styrene)-b-poly(dimethylsiloxane) (PS-b-PDMS). These systems and their processing may be at least in part analogous to the BCP comprising the PS-b-PMMA system discussed herein.

Referring again to FIG. 1D, to facilitate deposition and alignment of BCP material within the walls 110a and 110b, target brushes may be applied to the inner side of the walls 110a and 110b that are not covered by the layers 104a, . . . , 102e. In an example, the target brushes comprising guiding chemicals or guiding stripes may be applied on the exposed sections of the inner side of the walls 110a and 110b. In some embodiments, the brushes may be selected such that the guiding chemicals adhere to metal (e.g., and does not adhere to any of the layers 102a, ..., 102e or 104a, ..., 104d). In an example, the brushes may be selected such that the guiding chemicals are attracted to PMMA. Thus, for example, PMMA-attractive thiol brushes that graft to metal surface may be used, where the metal for the walls 110a and 110b and/or the brushes may be selected such that the brushes graft to the metal of the walls 110a and 110b. The brushes may be applied to the inner side of the walls 110a and 110b using any appropriate technique to apply such bushes.

In some embodiments, subsequent to applying the brushes, BCP material, such as PS-b-PMMA, may be deposited within the inner sides of the metals walls 110a and 110b. For example, referring to FIG. 1E, PMMA layers 120a and 120b, and PS layer 124a may be formed on one side of the layers 104a, ..., 102e; and PMMA layers 120c and 120d, and PS layer 124b may be formed on another side of the layers 104a, ..., 102e. The PMMA layers 120a, ..., 120d may be generally referred to herein as a PMMA layer 120 in singular, and PMMA layers 120 in plural. The PS layers 124a and 124b may be generally referred to herein as a PS layer 124 in singular, and PS layers 124 in plural. In an example, because the guiding chemicals or guiding stripes on the exposed sections of the inner side of the walls 110a and 110b are attracted specifically to PMMA (and not to PS), the PS-PMMA layers are deposited in the manner illustrated in FIG. 1E (e.g., PS in the middle and PMMA on two ends).

Figure 1E:
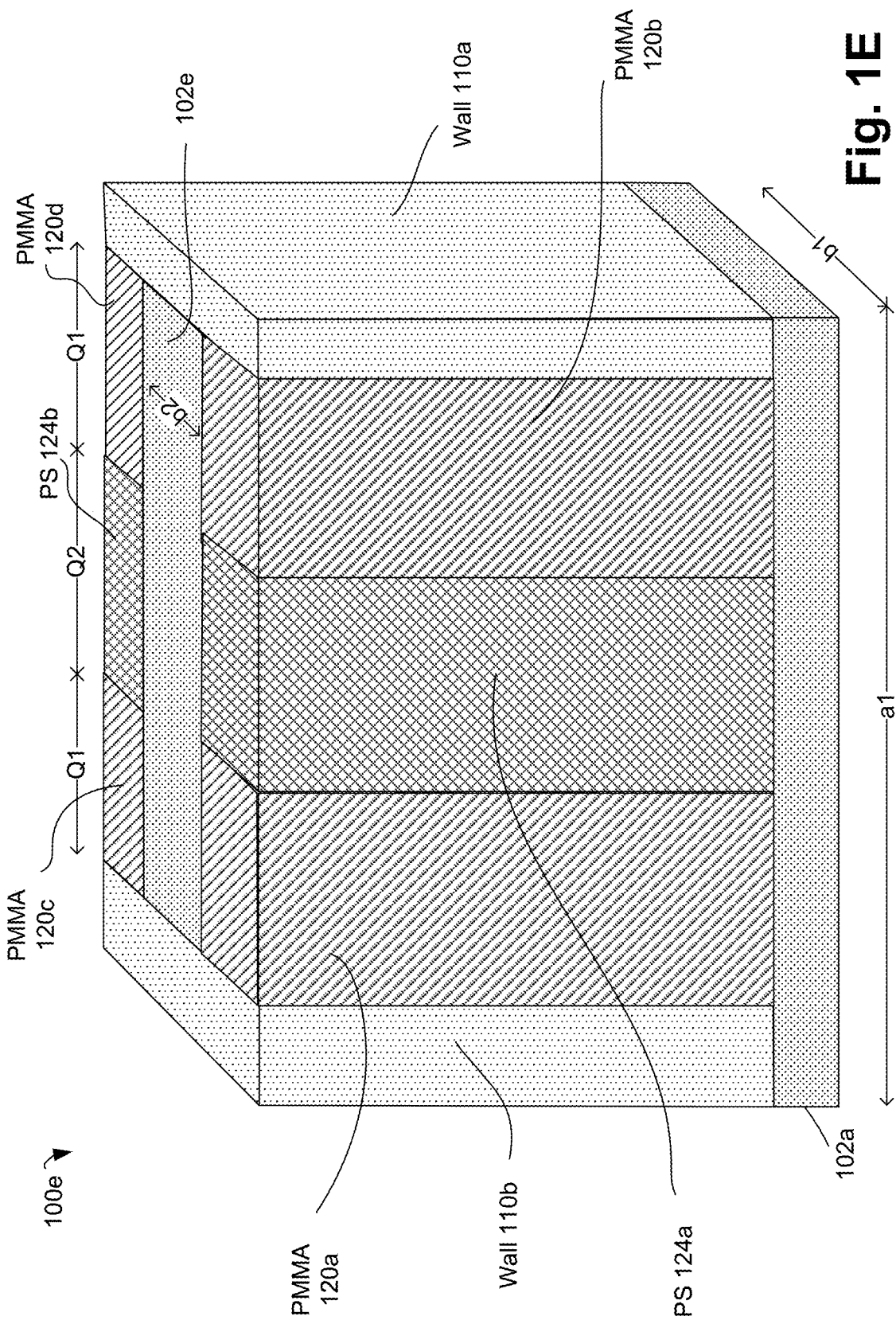

FIG. 1E illustrates a combination of graphoepitaxy technique and a chemoepitaxy technique for forming the BCP material within the walls 110a and 110b. For example, the walls 110a and 110b act as confining layers for the BCP material, e.g., as used in graphoepitaxy. Also, the guiding chemicals or guiding stripes on the exposed sections of the inner side of the walls 110a and 110b chemically guide the formation of the BCP material, e.g., as used in chemoepitaxy.

Figure 3:
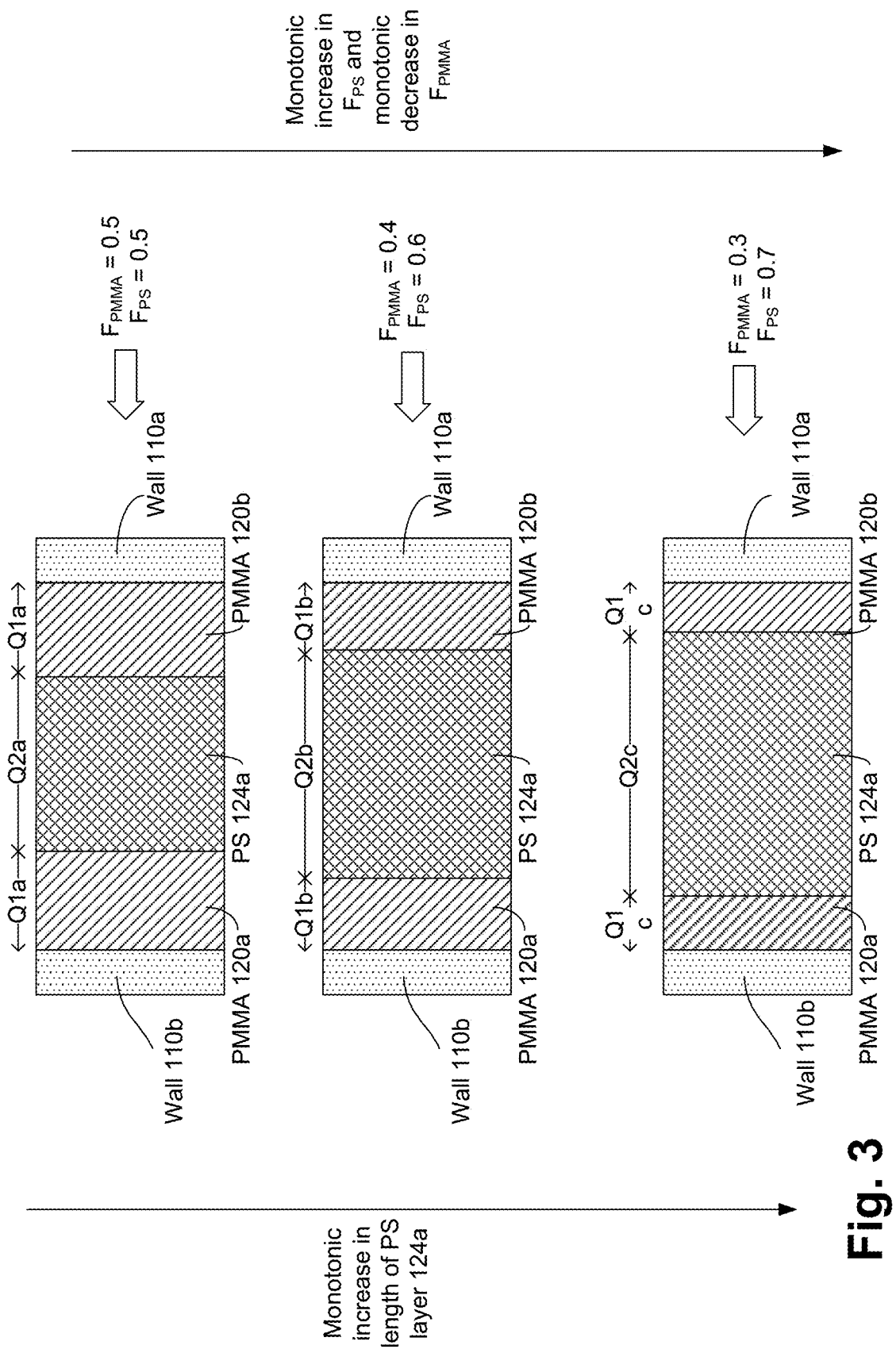
FIG. 3 illustrates an effect of block fractions of individual polymers within block copolymers (BCP) on a width of PS layers, according to some embodiments.

In some embodiments, block fractions of individual polymers within the BCP (e.g., ratio of PS material and PMMA material in the BCP) may be varied to control or tune a width of the PS and PMMA layers. FIG. 3 illustrates effect of block fractions of individual polymers within the BCP (e.g., ratio of PS material and PMMA material in the BCP) on a width of the PS layers 124a and 124b, according to some embodiments. For example, FIG. 3 illustrates three example scenarios with three different block fractions of the BCP used to form the polymer layers in FIG. 1E. The three scenarios correspond to cross-sectional views of the component 100e of FIG. 1E (although the layer 102a is not illustrated in the cross-sectional views of FIG. 3)

The top-most scenario depicted in FIG. 3 corresponds to a case where the block fractions of PS material and PMMA material are about the same (e.g., $F_{PMMA}=0.5$ and $F_{PS}=0.5$). In this case, the width of the PS layer 124a is about Q2a, and the width of the PMMA layers 120a and 120b is about Q1a.

In the middle scenario in FIG. 3, the fractional composition of the PMMA material is decreased and the fractional composition of the PS material is increased (e.g., $F_{PMMA}=0.4$ and $F_{PS}=0.6$). In this case, the width of the PS layer 124a is about Q2b, and the width of the PMMA layers 120a and 120b is about Q1b.

In the bottom-most scenario in FIG. 3, the fractional composition of the PMMA material is further decreased and the fractional composition of the PS material is further increased (e.g., $F_{PMMA}=0.3$ and $F_{PS}=0.7$). In this case, the width of the PS layer 124a is about Q2c, and the width of the PMMA layers 120a and 120b is about Q1c.

It can be seen that in FIG. 3, the width Q2c is higher than the width Q2b, which is higher than the width Q2a. Thus, the width of the PS layer 124 of FIG. 1E can be tuned, e.g., by varying the block fractional composition of the PS and PMMA material in the BCP. For example, with an increase in the fractional composition of the PS material in the BCP, a width of the PS layer 124 may increase, which eventually may increase a width of a vertical gate stack discussed herein later.

Referring to FIG. 1F, a component 100f may be formed by removing the PMMA layers 120a, 120b, 120c and 120d, e.g., by a wet or dry chemical etch process. In one embodiment, an etch used may be a plasma reactive ion etch known for removing polymer components selectively. Representatively, PMMA polymer may have a higher etch rate relative to PS polymers using argon/oxygen (Ar/O2), argon (Ar), nitrogen/hydrogen (N2/H2) and argon/carbon monoxide/nitrogen (Ar/CO/N2) etch chemistries. Wet etches using acetic acid may be generally selective to PMMA polymers relative to PS polymers. Accordingly, an appropriate etching process may be used to selectively remove the PMMA layers 120, without etching or removing the PS layer 124, thereby resulting in the component 100f of FIG. 1F.

Due to the removal of the PMMA layers 120, sections of the side walls of the layers 104a, ..., 104d and 102b, ..., 102e may be exposed. In some embodiments, the exposed sections of the layers 102b, 102c, 102d, and 102e (e.g., which are exposed due to the etching of the PMMA layers 120) may be doped using appropriate dopant, e.g., such that individual ones of these sections form a source region or a drain region. The doping can be done using any appropriate technique. For example, the doping can be introduced using Borosilicate glass (BSG) material, Phosphosilicate glass (PSG) deposed upon the exposed sections of layers 104a ... 104d and 102b ... 102e via a technique such as chemical vapor deposition (CVD) or atomic layer deposition (ALD), followed by a thermal anneal to diffuse doping from the BSG/PSG film to the exposed sections of layers 104a ... 104d and 102b ... 102e. In an example, an appropriate material with high amount of boron and/or phosphorous doping therein can be used for doping a silicon or germanium region. In another example, epitaxy techniques may be used for doping. For example, vapor phase epitaxy may be used for doping to depose a doped epitaxial material upon the exposed surfaces of layers 104a ... 104d and 102b ... 102e, followed by an anneal to diffuse doping into the exposed surfaces of the semiconductor layers 102b ... 102e. In another example, ion implantation may be used to dope the exposed sections of layers 102b ... 102e. The ion implantation may be performed such that the ions are directed in a non-vertical direction and may be performed with two or four or more ion beam orientations such as to efficiently dope all sides of the exposed layers 102b ... 102e. The ion implantation may be followed by a thermal anneal so as to electrically activate the doping. In yet another example, a plasma implantation operation may be used to dope the exposed sections of the layers 102b, ..., 102e, which may also be followed by a thermal anneal operation to electrically activate the doping.

Due to the doping, the section of the layer 102b on a right side of the PS layer 124 may become, for example, a source region of a first transistor; and the section of the layer 102b on a left side of the PS layer 124 may become, for example, a drain region of the first transistor. Similarly, the section of the layer 102c on the right side of the PS layer 124 may become, for example, a source region of a second transistor;

and the section of the layer 102c on the left side of the PS layer 124 may become, for example, a drain region of the second transistor. Similarly, sections of the layers 102d and 102e can form source/drain regions of a third and a fourth transistor, respectively.

In some embodiments, the wall 110a may form a common source contact for the source regions of the four transistors, and the wall 110b may form a common drain contact for the drain regions of the four transistors. As also discussed herein later, in some embodiments, the wall 110a may be segregated in different sections (e.g., by selectively removing sections of the wall 110a) to separate the source contacts of the four transistors. Similarly, in some embodiments, the wall 110b may be segregated in different sections (e.g., by selectively removing sections of the wall 110b) to separate the drain contacts of the four transistors.

In some embodiments, while the layers 102b, . . . , 102e are being selectively doped, the PS layers 124 may protect or prevent sections of the layers 102b, . . . , 102e from being doped. As discussed herein later, these sections of the layers 102b, . . . , 102e (e.g., which are prevented from being doped) eventually form channel regions of the above discussed transistors.

Figure 1G:
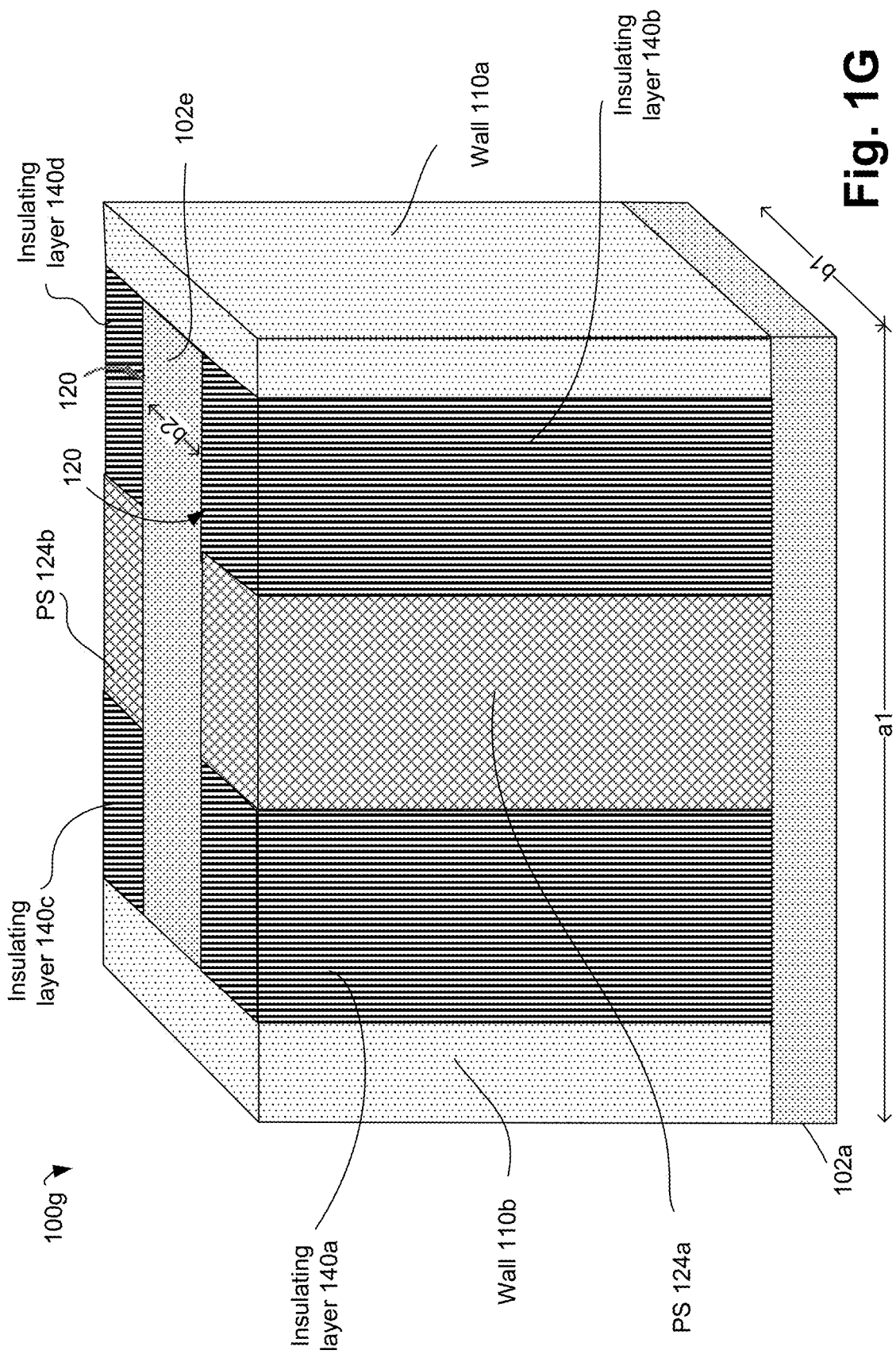

Referring now to FIG. 1G, insulating material may be deposited in the openings generated by removing the PMMA layers, thereby forming insulating layers 140a, 140b, 140c, and 140d in a component 100g. Any appropriate insulating material may be used for the insulating layers 140.

Figure 1H:
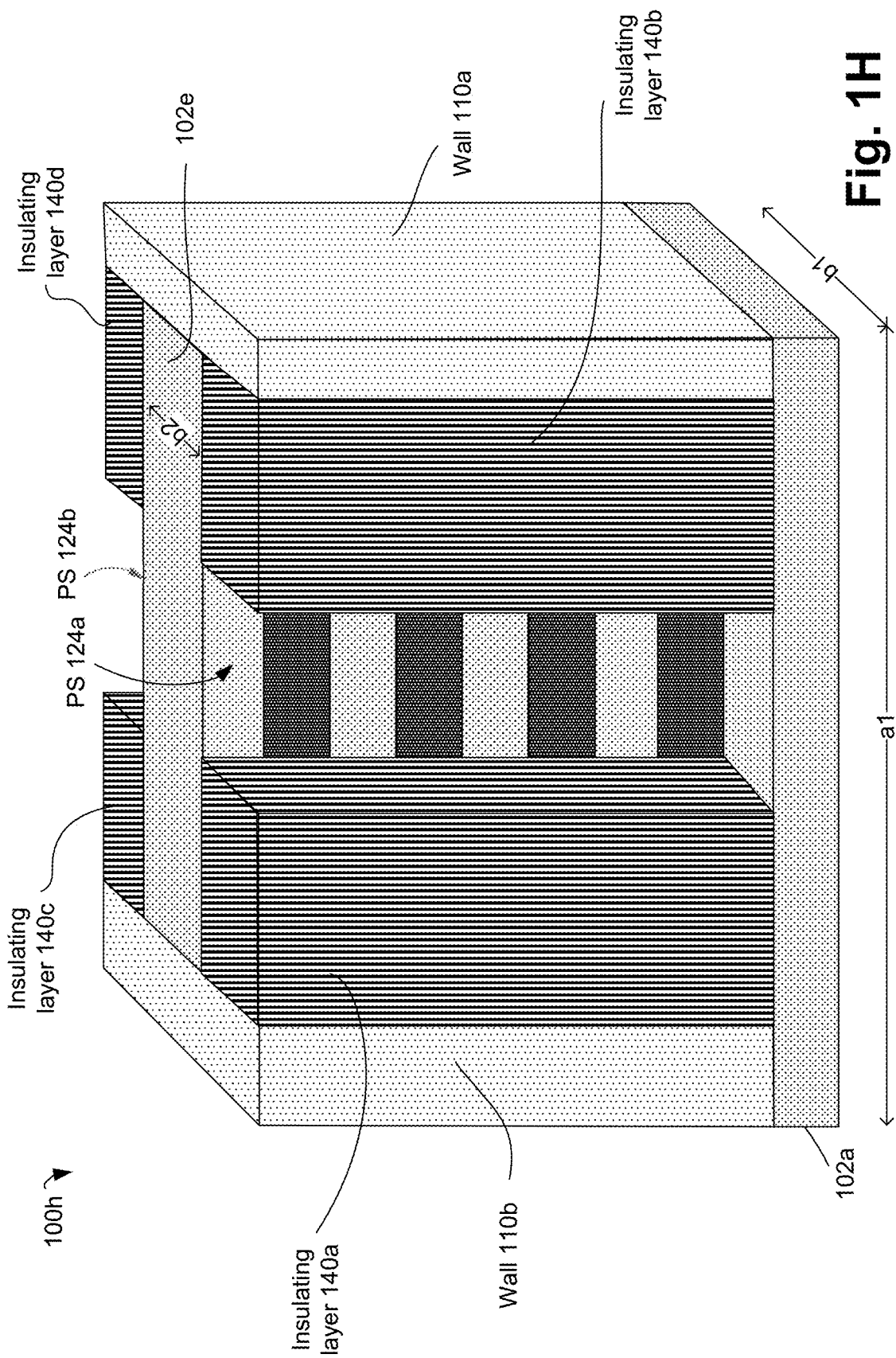

Referring to FIG. 1H, a component 100h may be formed by removing the PS layers 124a and 124b from the component 100g, e.g., by a wet or dry chemical etch process. In one embodiment, an etch used may be a plasma reactive ion etch known for removing polymer components selectively. Merely as an example, the PS layers 124 may be selectively dry etched with the use of an Oxygen/Helium plasma.

Figure 1I:
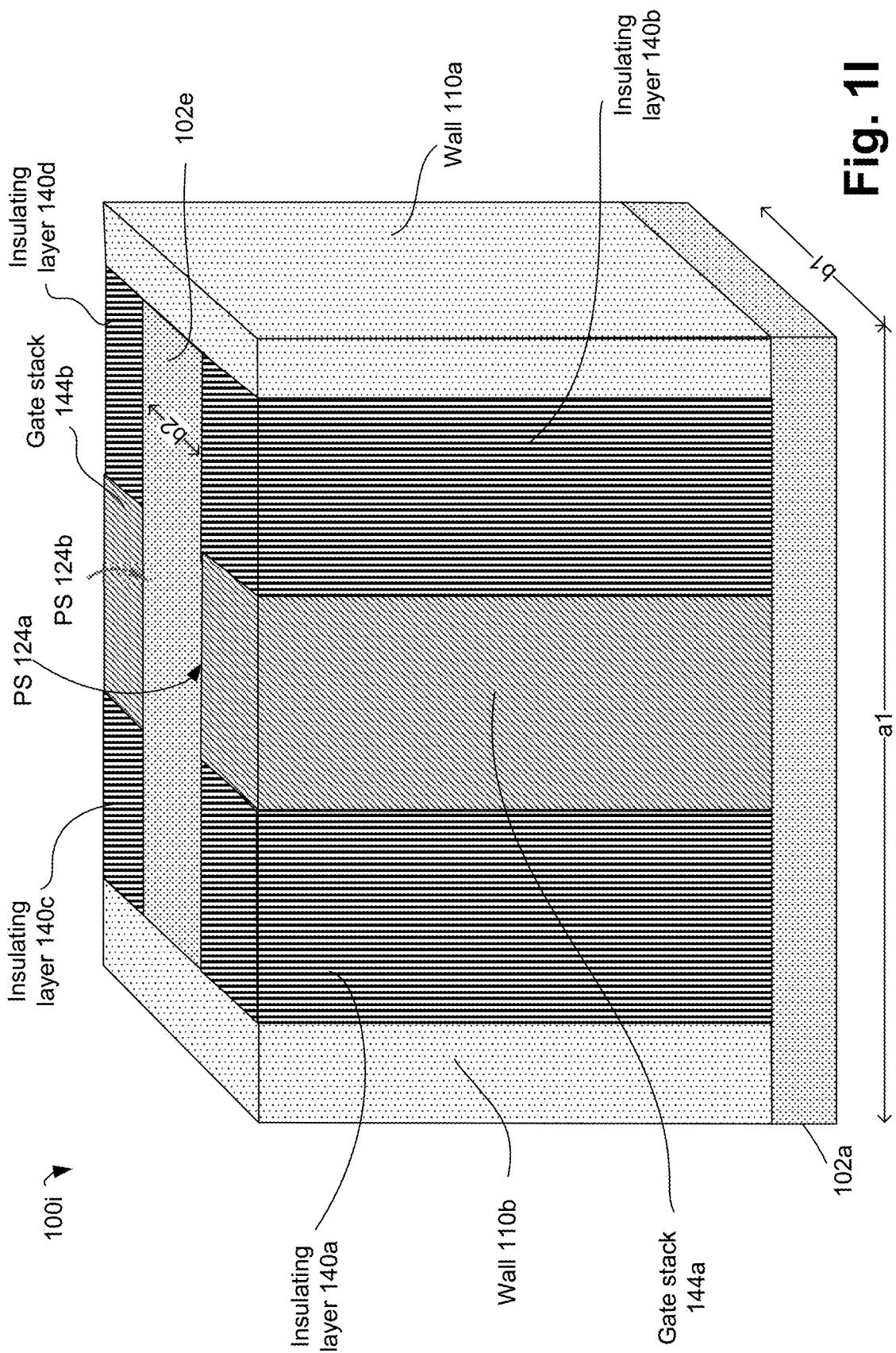

Referring to FIG. 1I, a component 100i may be formed by forming gate stacks 144a and 144b in the void created by removing the PS layers 124a and 124b, respectively. In some embodiments, the gate stacks 144a and/or 144b may comprise traces of PS material. For example, the PS layers 124a and/or 124b may not be fully removed, and hence, the gate stacks 144a and/or 144b may comprise traces of the PS layers 124a and/or 124b, respectively. For example, inner sidewalls of the gate stacks 144a and/or 144b may comprise traces of the PS layers 124a and/or 124b, respectively. For example, the inner sidewalls of the gate stacks 144a and/or 144b may be contact with regions where the PS layers 124a and/or 124b, respectively, were formed. Accordingly, inner sidewalls of the gate stacks 144a and/or 144b may comprise traces of the PS layers 124a and/or 124b, respectively. As example of an inner sidewall of the gate stack 144a may be a sidewall of the gate stack 144a that is in contact with the layers 102b, 104b, 102c, . . . , 104d, 102e. Also, the sections of the layers 102b, 104b, 102c, . . . , 104d, which are adjacent to the gate stacks 144a and 144b, may also comprise traces of PS layer material. Another example of inner sidewalls of the gate stack 144a may be sidewalls of the gate stack 144a that are in contact with the adjacent insulating layers 140a and 140b.

In some embodiments and referring back to FIG. 1G, the insulating layers 140a, 140b, 140c, and/or 140d may comprise traces of PMMA material. For example, the insulating layers 140a, 140b, 140c, and/or 140d may be formed in openings formed by removing of PMMA layers 120. For example, the PMMA material of one or more of the PMMA layers 120 may not be fully or completely removed, and hence, the insulating layers 140 may comprise traces of the PMMA material. For example, one or more inner sidewalls of the insulating layers 140a, 140b, 140c, and/or 140d may comprise traces of PMMA material from the PMMA layers 120. As example of an inner sidewall of the insulating layer 140a may be a sidewall of the insulating layer 140a that is in contact with the layers 102b, 104b, 102c, . . . , 104d, 102e. Another example of inner sidewall of the insulating layer 140a may be a sidewall of the insulating layer 140a that are in contact with the wall 110a. In some embodiments, the inner sidewalls of the walls 110a, 110b (e.g., which are adjacent to the insulating layers 140) may also comprise traces of PMMA layer material.

Referring again to FIG. 1I, in some embodiments, each gate stack may be formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. The gate electrode layer may be formed on the gate dielectric layer and may include at least one P-type workfunction metal or N-type workfunction metal, depending on whether the transistor is to be a p-type (e.g., PMOS) or an n-type (e.g., NMOS) transistor. In some implementations, the gate electrode layer may include a stack of two or more metal layers, where one or more metal layers are workfunction metal layers and at least one metal layer is a fill metal layer. Further metal layers may be included for other purposes, such as a barrier layer.

For example, for a p-type transistor, metals that may be used for the gate electrode include, but are not limited to, ruthenium, palladium, platinum, cobalt, nickel, and conductive metal oxides, e.g., ruthenium oxide. A P-type metal layer may enable the formation of a p-type gate electrode with a workfunction that is between about 4.9 eV and about 5.2 eV. For an n-type transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer may enable the formation of an NMOS gate electrode with a workfunction that is between about 3.9 eV and about 4.2 eV.

Thus, the component 100i comprises a stack of transistors. For example, for a lower most transistor, the doped sections of the layer 102b (e.g., which were doped while the sections of the layer 102b was exposed, as discussed with respect to FIG. 1F) may form source and drain regions of the transistor; portions of the walls 110a and 110b may form the source and drain contacts; the section of the layer 102b covered by the gate stacks 144a and 144b (which were prevented from being doped by the PS layer 124) may form a channel of the transistor; and portions of the gate stacks 144a and 144b form the gate contact.

In some embodiments, the wall 110a, for example, form a common source contact for all the stacked transistors; and the wall 110b, for example, form a common drain contact for all the stacked transistors. If, for example, such a common source contact and a common drain contact is not desired (e.g., if individual and independent transistors are desired instead), the walls 110a and 110b can be cut and segregated in multiple sections corresponding to the multiple transistors formed in the component 100i. For example, FIG. 100I illustrates formation of four transistors. Accordingly, three horizontal sections of the metal gate 110a may be removed (not illustrated in the figures) such that the metal gate 100a may be divided in four horizontal sections, each contacting a respective one of the layers 102b, 102c, 102d, and 102e. Accordingly, four separate source contacts for the four transistors may be formed.

FIGS. 1F-1I illustrate initially removing the PMMA layers 120, doping the source/drain regions, forming the insulating layers 140, then removing the PS layers 124, and forming the gate stack 144. However, in some other embodiments, the process can be reversed. For example, in such alternative embodiments, the PS layers 124 may initially be removed and the gate stacked may be formed. Subsequently, the PMMA layers 120 can be removed and the source/drain regions can be doped, followed by formation of the insulating layers 140.

FIGS. 1A-1I illustrate a specific number of stacked devices. However, the principles of this disclosure may be applied to form a different number of stacked devices. For example, ones, tens or even hundreds of such stacked devices may be formed using the principles of this disclosure.

As discussed with respect to FIG. 3, a width of the PS layers 124 may be controlled by appropriately controlling the block fractions of the PS and PMMA. Thus, a width of the channel and a width of the gate stack of the stacked devices may be tuned by appropriately controlling the block fractions of the PS and PMMA using the same process and on a same wafer.

In some embodiments, due to the use of the DSA process using the BCP (e.g., comprising PS and PMMA, or other appropriate polymers), the PMMA layers 120 and the PS layers 124 may be self-aligned layers. Thus, the source regions of the stacked devices are also self-aligned for any number of stacked devices. Similarly, the drain regions of the stacked devices are also self-aligned for any number of stacked devices; and the gate of the stacked devices are also self-aligned for any number of stacked devices.

There are many technical advantages of various embodiments. For example, the principles of this disclosure, which utilizes DSA using BCP such as PS-PMMA, may be used to form a large number of vertically stacked devices. The source regions of these devices may be self-aligned, and similarly the drain, gate and channel regions may also be self-aligned. Such alignment of various vertically stacked devices using, for example, lithography and etching, may not be possible (e.g., when the number of devices increases), e.g., due to tapering of an etch process. Thus, a conventional process may require patterning of individual layers using lithography, which may be time consuming and/or costly. In contrast, the principles of this disclosure results in self aligned regions of a large number of stacked devices. Furthermore, a width of the channel and a width of the gate stack of the stacked devices may be easily tuned by appropriately controlling the block fractions of the polymers in the BCP.

These processes may be used multiple times on different groups of transistors so as to create populations of transistors with differing widths of the gate stack. For example, in a stack of N number of transistors, top n1 number of transistors may have a first width of gate stack, and a bottom n2 number of transistors may have a second width of gate stack, the second width being different from the first width. Having different gate stack width in a vertical transistor stack may have many advantages, e.g., in low-power circuit design or other application areas, as will be evident to one skilled in the art. Other technical effects will be evident from the various embodiments and figures.

Figure 4:
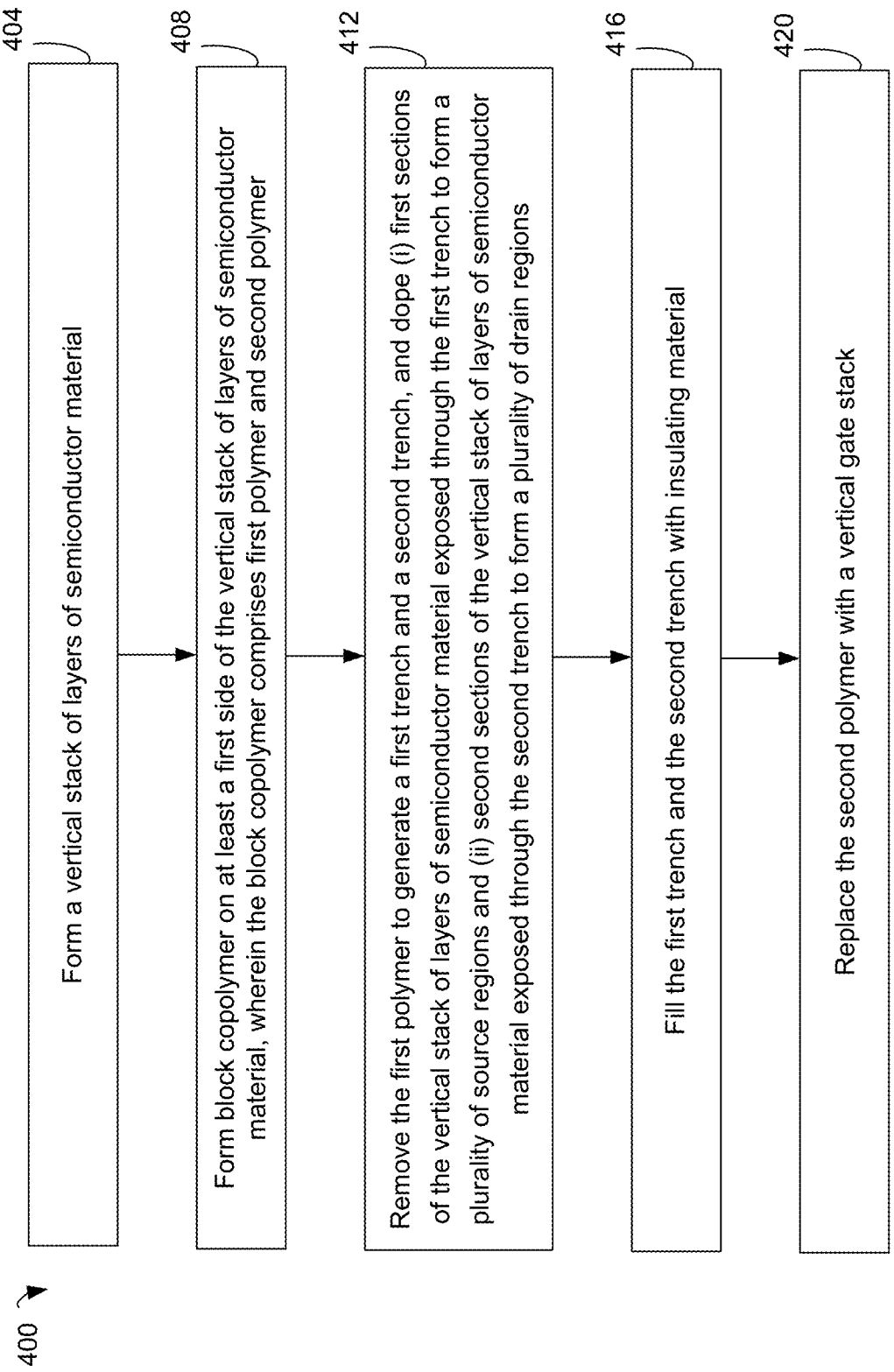
FIG. 4 illustrates a flowchart depicting a method for formation of vertically stacked devices using DSA techniques, according to some embodiments.

FIG. 4 illustrates a flowchart depicting a method 400 for formation of vertically stacked devices using Direct Self Assembly (DSA) techniques, according to some embodiments. At 404, a vertical stack of layers of semiconductor material (e.g., layers 102b, . . . , 102e of FIGS. 1A-1I) may be formed. In some embodiments, layers of insulating material (e.g., layers 104a, . . . , 104d) may be stacked alternatingly with the layers of semiconductor material.

Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At 408, block copolymer may be formed on at least a first side of the vertical stack of layers of semiconductor material, e.g., as discussed with respect to FIG. 1E. The block copolymer may comprise first polymer (e.g., PMMA layers 120) and second polymer (e.g., PS layers 124).

At 412, the first polymer may be removed to generate a first trench (e.g., formed by removing the PMMA layer 120a) and a second trench (e.g., formed by removing the PMMA layer 120b), e.g., as discussed with respect to FIG. 1F. In some embodiments, first sections of the vertical stack of layers of semiconductor material exposed through the first trench may be doped to form a plurality of source regions, e.g., as discussed with respect to FIG. 1F. In some embodiments, second sections of the vertical stack of layers of semiconductor material exposed through the second trench may be doped to form a plurality of drain regions, e.g., as discussed with respect to FIG. 1F.

At 416, the first trench and the second trench may be filled with insulating material (e.g., insulating layers 140 of FIG. 1G). At 420, the second polymer (e.g., PS layers 124) may be replaced with a vertical gate stack (e.g., gate stack 144a, as discussed with respect to FIGS. 1H-1I).

Figure 5:
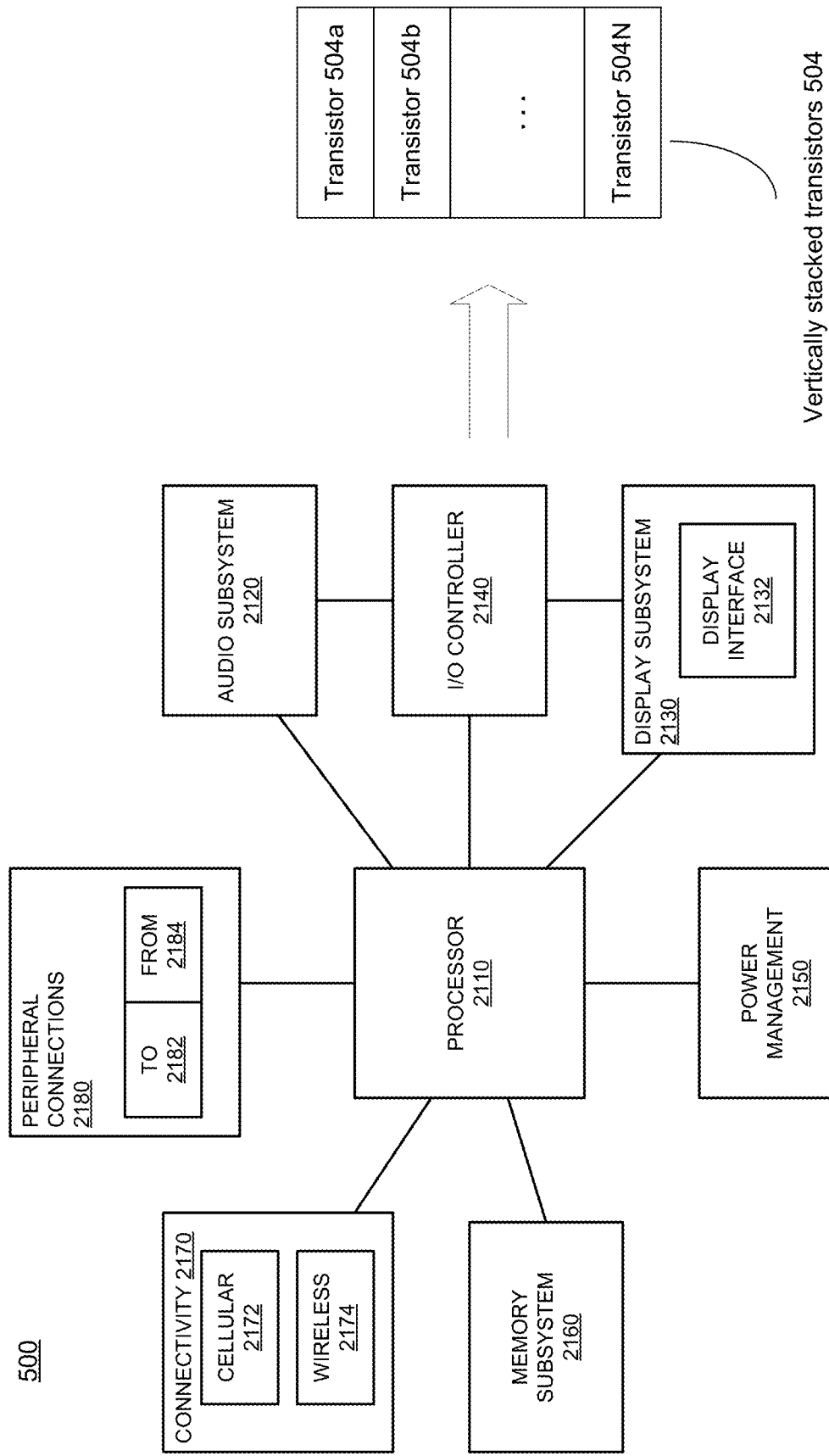
FIG. 5 illustrates a computer system, a computing device or a SoC (System-on-Chip), where one or more components of the computing device comprise vertically stacked transistors formed using DSA process using BCP, in accordance with some embodiments.

FIG. 5 illustrates a computer system, a computing device or a SoC (System-on-Chip) 2100, where one or more components of the computing device 2100 comprise vertically stacked transistors (e.g., vertically stacked transistors 504) formed using DSA process using BCP (e.g., comprising PS-b-PMMA), in accordance with some embodiments. It is pointed out that those elements of FIG. 5 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, one or more components of the computing device 2100 (e.g., the processor 2110, a memory in the memory subsystem 2160, and/or the like) comprises vertically stacked transistors. Illustrated in FIG. 5 are vertically stacked transistors 504 comprising transistors 504a, 504b, . . . , 504N. In some embodiments, the vertically stacked transistors 504 are formed at least in part by DSA techniques using BCP, e.g., as discussed with respect to FIGS. 1A-1I and as discussed herein above.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Clause 1. An integrated circuit structure comprising: a stack of source regions of a stack of transistors and a stack of drain regions of the stack of transistors; and a gate stack that forms gate regions for the stack of transistors, wherein the gate stack comprises traces of a first polymer of a block copolymer, the block copolymer comprising the first polymer and a second polymer.

Clause 2. The integrated circuit structure of clause 1, wherein: a sidewall of the gate stack comprises the traces of the first polymer.

Clause 3. The integrated circuit structure of any of clauses 1-2, further comprising: a layer, wherein a source region of the stack of source regions is formed by doping a first section of the layer, wherein a drain region of the stack of drain regions is formed by doping a second section of the layer, and wherein a section of the gate stack is formed on a third section of the layer, the third section of the layer between the first section of the layer and the second section of the layer.

Clause 4. The integrated circuit structure of any of clauses 1-3, further comprising: a first insulating region formed on the stack of source regions, wherein the first insulating region comprises traces of the second polymer of the block copolymer.

Clause 5. The integrated circuit structure of clause 4, wherein the traces of the second polymer are first traces of the second polymer, and wherein the integrated circuit structure further comprises: a second insulating region formed on the stack of drain regions, wherein the second insulating region comprises second traces of the second polymer of the block copolymer.

Clause 6. The integrated circuit structure of clause 4, wherein: a sidewall of the first insulating region, which is adjacent to the stack of source regions, comprises the traces of the second polymer of the block copolymer.

Clause 7. The integrated circuit structure of any of clauses 1-6, wherein the first polymer is polystyrene (PS), and the second polymer is polymethylmethacrylate (PMMA).

Clause 8. A method comprising: forming a stack of layers of semiconductor material; forming block copolymer on at least a first side of the stack of layers of semiconductor material, wherein the block copolymer comprises first polymer and second polymer; and replacing the first polymer of the block copolymer with a gate stack.

Clause 9. The method of clause 8, further comprising: removing the second polymer to generate a first trench and a second trench, wherein the first trench exposes first sections of the stack of layers of semiconductor material and the second trench exposes second sections of the stack of layers of semiconductor material; and doping the first sections of the vertical stack of layers of semiconductor material exposed through the first trench to form a plurality of source regions of a corresponding plurality of devices.

Clause 10. The method of clause 9, further comprising: doping the second sections of the stack of layers of semiconductor material exposed through the second trench to form a plurality of drain regions of the corresponding plurality of devices.

Clause 11. The method of clause 10, further comprising: filing the first trench and the second trench with insulating material, subsequent to doping the first sections and the second sections.

Clause 12. The method of any of clauses 8-11, further comprising: forming a first wall and a second wall on respectively a second side and a third side of the vertical stack of layers of semiconductor material, wherein the second side and the third side are perpendicular to the first side, wherein a first section of the first wall and a first section of the second wall are not covered by the vertical stack of layers of semiconductor material; and applying a first brush to the first section of the first wall and a second brush to the second section of the second wall, prior to depositing the block copolymer.

Clause 13. The method of clause 11, wherein: the first brush and the second brush have affinity to the second polymer.

Clause 14. The method of any of clauses 8-13, further comprising: setting a width of the gate stack by selecting a block fraction of the first polymer and a block fraction of the second polymer within the block copolymer.

Clause 15. The method of any of clauses 8-14, wherein forming the stack of layers of semiconductor material comprises: forming the stack of layers of semiconductor material such that each two adjacent layers of semiconductor material is separated by a corresponding layer of insulating material.

Clause 16. A method comprising: forming a layer of block copolymer, wherein the layer of block copolymer comprises a first layer of first polymer, a second layer of first polymer, and a third layer of second polymer formed between the first layer and the second layer; selectively removing the first layer of first polymer and the second layer of second polymer to respectively form a first trench and a second trench; and doping a plurality of source regions through the first trench and a plurality of drain regions through the second trench.

Clause 17. The method of clause 16, further comprising: filing the first trench and the second trench with insulating material.

Clause 18. The method of clause 17, further comprising: subsequent to filing the first trench and the second trench with the insulating material, selectively removing the third layer of second polymer to form a third trench; and forming a gate stack within the third trench.

Clause 19. The method of clause 18, further comprising: controlling a width of the gate stack by controlling block fractions of the first polymer and the second polymer within the block copolymer.

Clause 20. The method of any of clauses 16 to 19, wherein the first polymer is polymethylmethacrylate (PMMA), and the second polymer is polystyrene (PS).

Clause 21. A system comprising: a memory to store instructions; a processor coupled to the memory; a wireless interface; and a stack of transistors comprising a gate stack formed between a first insulating region and a second insulating region, wherein the first insulating region comprises traces of a first polymer of a block copolymer, the block copolymer comprising the first polymer and a second polymer.

Clause 22. The system of clause 21, wherein: the traces of the first polymer comprise first traces of the first polymer; and the second insulating region comprises second traces of the first polymer of the block copolymer.

Clause 23. The system of any of clauses 21-22, wherein: the gate stack comprises traces of the second polymer of the block copolymer.

Clause 24. The system of any of clauses 21-24, further comprising: a plurality of source regions of the stack of transistors; and a plurality of drain regions of the stack of transistors.

Clause 25. The system of any of clauses 21-24, wherein: the first polymer is one of polymethylmethacrylate (PMMA) and polystyrene (PS), and the second polymer is another of PMMA and PS.

Clause 26. A vertical stack of transistors comprising: a vertical stack of source regions and a vertical stack of drain regions; and a vertical gate stack that forms gate regions for the vertical stack of transistors, wherein the vertical gate stack comprises traces of a first polymer of a block copolymer, the block copolymer comprising the first polymer and a second polymer.

Clause 27. The vertical stack of transistors of clause 26, wherein: the vertical gate stack is formed by (i) removing the first polymer to form a trench, and (ii) forming the vertical gate stack within the trench.

Clause 28. The vertical stack of transistors of any of clauses 26-27, wherein: the vertical stack of source region is doped through a first opening formed by removal of the second polymer.

Clause 29. The vertical stack of transistors of clause 28, wherein: the vertical stack of drain region is doped through a second opening formed by removal of the second polymer.

Clause 30. The vertical stack of transistors of any of clauses 26-29, wherein: a width of the gate stack is based at least in part on block fractions of the first polymer and the second polymer within the block copolymer.

Clause 31. The vertical stack of transistors of any of clauses 26-30, wherein the first polymer is polystyrene (PS), and the second polymer is polymethylmethacrylate (PMMA).

Clause 32. An apparatus comprising: means for performing a method of clauses 8-20.

Clause 33. An apparatus comprising: means for forming a stack of layers of semiconductor material; means for forming block copolymer on at least a first side of the stack of layers of semiconductor material, wherein the block copolymer comprises first polymer and second polymer; and means for replacing the first polymer of the block copolymer with a gate stack.

Clause 34. The apparatus of clause 33, further comprising: means for removing the second polymer to generate a first trench and a second trench, wherein the first trench exposes first sections of the stack of layers of semiconductor material and the second trench exposes second sections of the stack of layers of semiconductor material; and means for doping the first sections of the vertical stack of layers of semiconductor material exposed through the first trench to form a plurality of source regions of a corresponding plurality of devices.

Clause 35. The apparatus of clause 34, further comprising: means for doping the second sections of the stack of layers of semiconductor material exposed through the second trench to form a plurality of drain regions of the corresponding plurality of devices.

Clause 36. The apparatus of clause 35, further comprising: means for filing the first trench and the second trench with insulating material, subsequent to doping the first sections and the second sections.

Clause 37. The apparatus of any of clauses 33-36, further comprising: forming a first wall and a second wall on respectively a second side and a third side of the vertical stack of layers of semiconductor material, wherein the second side and the third side are perpendicular to the first side, wherein a first section of the first wall and a first section of the second wall are not covered by the vertical stack of layers of semiconductor material; and applying a first brush to the first section of the first wall and a second brush to the second section of the second wall, prior to depositing the block copolymer.

Clause 38. The apparatus of clause 36, wherein: the first brush and the second brush have affinity to the second polymer.

Clause 39. The apparatus of any of clauses 33-38, further comprising: means for setting a width of the gate stack by selecting a block fraction of the first polymer and a block fraction of the second polymer within the block copolymer.

Clause 40. The apparatus of any of clauses 33-39, wherein the means for forming the stack of layers of semiconductor material comprises: means for forming the stack of layers of semiconductor material such that each two adjacent layers of semiconductor material is separated by a corresponding layer of insulating material.

Clause 41. An apparatus comprising: means for forming a layer of block copolymer, wherein the layer of block copolymer comprises a first layer of first polymer, a second layer of first polymer, and a third layer of second polymer formed between the first layer and the second layer; means for selectively removing the first layer of first polymer and the second layer of second polymer to respectively form a first trench and a second trench; and means for doping a plurality of source regions through the first trench and a plurality of drain regions through the second trench.

Clause 42. The apparatus of clause 41, further comprising: means for filing the first trench and the second trench with insulating material.

Clause 43. The apparatus of clause 42, further comprising: means for selectively removing the third layer of second polymer to form a third trench, subsequent to filing the first trench and the second trench with the insulating material; and means for forming a gate stack within the third trench.

Clause 44. The apparatus of clause 43, further comprising: means for controlling a width of the gate stack by controlling block fractions of the first polymer and the second polymer within the block copolymer.

Clause 45. The apparatus of any of clauses 41 to 44, wherein the first polymer is polymethylmethacrylate (PMMA), and the second polymer is polystyrene (PS).

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit structure comprising:
a stack of source regions of a stack of transistors and a stack of drain regions of the stack of transistors; and
a gate stack comprising gate regions for the stack of transistors,
wherein the gate stack comprises traces of a first polymer of a block copolymer, the block copolymer comprising the first polymer and a second polymer.

2. The integrated circuit structure of claim 1, wherein:
a sidewall of the gate stack comprises the traces of the first polymer.

3. The integrated circuit structure of claim 1, further comprising:
a layer,
wherein a source region of the stack of source regions comprises a doped first section of the layer,
wherein a drain region of the stack of drain regions comprises a doped second section of the layer, and
wherein a section of the gate stack is on a third section of the layer, the third section of the layer between the doped first section of the layer and the doped second section of the layer.

4. The integrated circuit structure of claim 1, further comprising:
a first insulative region on the stack of source regions, wherein the first insulative region comprises traces of the second polymer of the block copolymer.

5. The integrated circuit structure of claim 4, wherein the traces of the second polymer are first traces of the second polymer, and wherein the integrated circuit structure further comprises:
a second insulative region on the stack of drain regions, wherein the second insulative region comprises second traces of the second polymer of the block copolymer.

6. The integrated circuit structure of claim 4, wherein:
a sidewall of the first insulative region, which is adjacent to the stack of source regions, comprises the traces of the second polymer of the block copolymer.

7. The integrated circuit structure of claim 1, wherein the first polymer comprises polystyrene (PS), and the second polymer comprises polymethylmethacrylate (PMMA).

8. A system comprising:
a memory to store instructions;
a processor coupled to the memory;
a wireless interface; and
a stack of transistors comprising a gate stack formed between a first insulative region and a second insulative region,
wherein the first insulative region comprises traces of a first polymer of a block copolymer, the block copolymer comprising the first polymer and a second polymer.

9. The system of claim 8, wherein:
the traces of the first polymer comprise first traces of the first polymer; and
the second insulative region comprises second traces of the first polymer of the block copolymer.

10. The system of claim 8, wherein:
the gate stack comprises traces of the second polymer of the block copolymer.

11. The system of claim 8, further comprising:
a plurality of source regions of the stack of transistors; and
a plurality of drain regions of the stack of transistors.

12. The system of claim 8, wherein:
the first polymer includes one of polymethylmethacrylate (PMMA) and polystyrene (PS), and the second polymer includes another of PMMA and PS.

* * * * *